United States Patent
Matsushita

(10) Patent No.: US 11,322,581 B2
(45) Date of Patent: May 3, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Kenichi Matsushita, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 58 days.

(21) Appl. No.: 17/015,640

(22) Filed: Sep. 9, 2020

(65) Prior Publication Data

US 2021/0280671 A1 Sep. 9, 2021

(30) Foreign Application Priority Data

Mar. 4, 2020 (JP) .............................. JP2020-036827

(51) Int. Cl.
*H01L 29/06* (2006.01)

(52) U.S. Cl.
CPC ...... *H01L 29/0619* (2013.01); *H01L 29/0638* (2013.01)

(58) Field of Classification Search
CPC .......................... H01L 29/0619; H01L 29/0638
USPC ...................................................... 257/409
See application file for complete search history.

(56) References Cited

U.S. PATENT DOCUMENTS

| | | | |
|---|---|---|---|
| 5,323,029 A | 6/1994 | Nishizawa | |
| 8,890,169 B2 | 11/2014 | Kameshiro et al. | |
| 10,734,241 B1* | 8/2020 | Fujita | H01L 29/7813 |
| 2003/0080375 A1 | 5/2003 | Takahashi et al. | |
| 2006/0131685 A1* | 6/2006 | Watanabe | H01L 29/8611 |
| | | | 257/483 |

FOREIGN PATENT DOCUMENTS

| | | |
|---|---|---|
| JP | 2509127 B2 | 6/1996 |
| JP | 3175870 B2 | 6/2001 |
| JP | 3701227 B2 | 9/2005 |
| JP | 5642191 B2 | 12/2014 |

* cited by examiner

*Primary Examiner* — Igwe U Anya
(74) *Attorney, Agent, or Firm* — Allen & Overy LLP

(57) ABSTRACT

According to one embodiment, a semiconductor device includes first, second, and third electrodes, first and fourth semiconductor regions of a first conductivity type, and second and third semiconductor regions of a second conductivity type. The third semiconductor region is provided around the second semiconductor region along a first plane crossing a first direction from the first electrode toward the first semiconductor region and is separated from the second semiconductor region. The fourth semiconductor region is provided around the third semiconductor region along the first plane, and has a greater impurity concentration of the first conductivity type than the first semiconductor region. The second electrode is provided on the second semiconductor region and is electrically connected to the second semiconductor region. The third electrode is provided on the third and fourth semiconductor regions, is electrically connected to the third and fourth semiconductor regions, and is separated from the second electrode.

9 Claims, 11 Drawing Sheets

SEMICONDUCTOR DEVICE

CROSS-REFERENCE TO RELATED APPLICATIONS

This application is based upon and claims the benefit of priority from Japanese Patent Application No. 2020-036827, filed on Mar. 4, 2020; the entire contents of which are incorporated herein by reference.

FIELD

Embodiments described herein relate generally to a semiconductor device.

BACKGROUND

Semiconductor devices such as diodes, metal oxide semiconductor field effect transistors (MOSFETs), insulated gate bipolar transistors (IGBTs), etc., are used in applications such as power conversion. It is desirable that damage of the semiconductor devices does not occur easily at breakdown.

DETAILED DESCRIPTION

Figure 1:
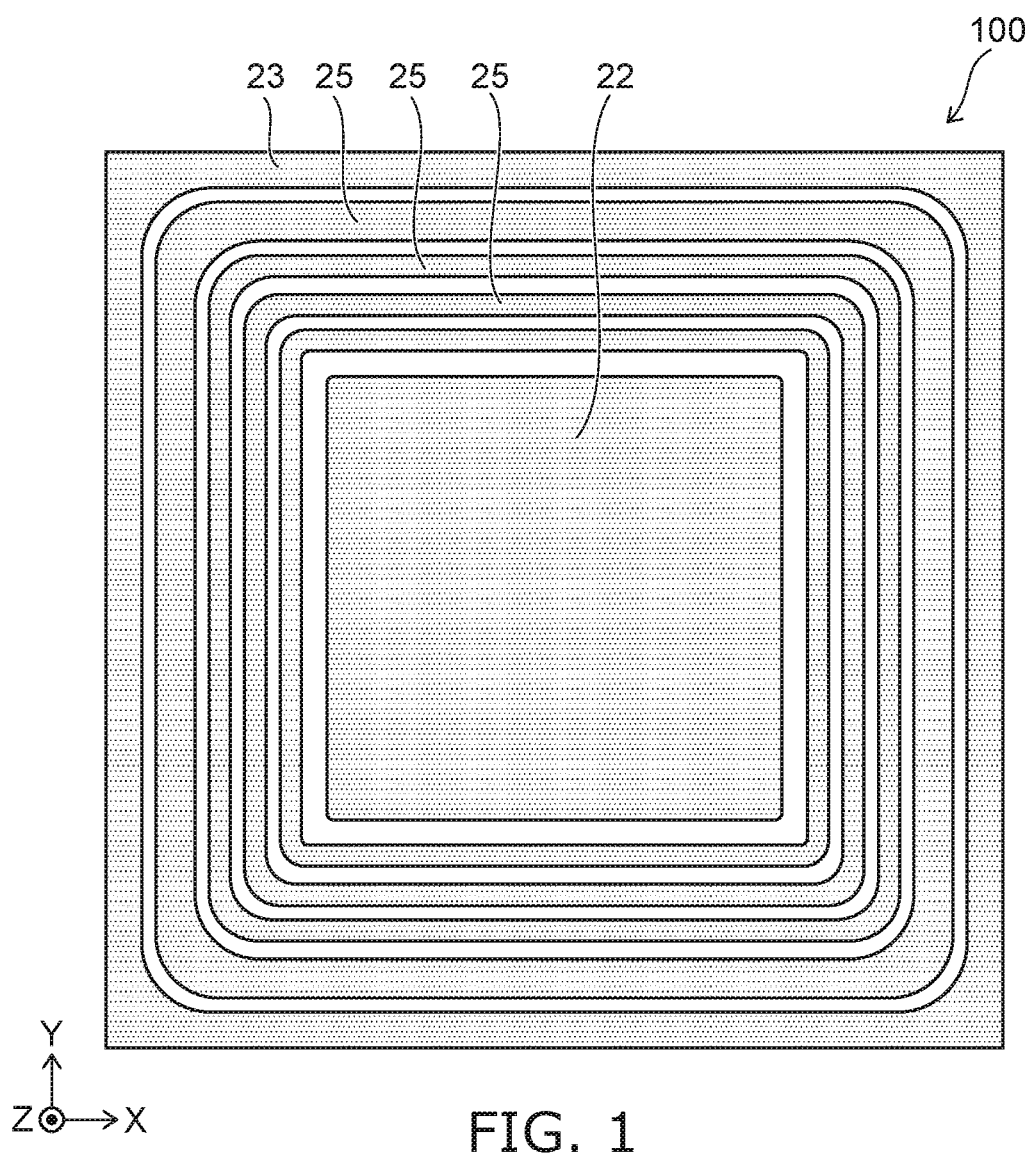
FIG. 1 is a plan view illustrating a semiconductor device according to a first embodiment.

According to one embodiment, a semiconductor device includes a first electrode, a first semiconductor region of a first conductivity type, a second semiconductor region of a second conductivity type, a third semiconductor region of the second conductivity type, a fourth semiconductor region of the first conductivity type, a second electrode, and a third electrode. The first semiconductor region is provided on the first electrode, and is electrically connected to the first electrode. The second semiconductor region is provided on the first semiconductor region. The third semiconductor region is provided around the second semiconductor region along a first plane crossing a first direction, and is separated from the second semiconductor region. The first direction is from the first electrode toward the first semiconductor region. The fourth semiconductor region is provided around the third semiconductor region along the first plane. An impurity concentration of the first conductivity type in the fourth semiconductor region is greater than an impurity concentration of the first conductivity type in the first semiconductor region. The second electrode is provided on the second semiconductor region and electrically connected to the second semiconductor region. The third electrode is provided on the third and fourth semiconductor regions, electrically connected to the third and fourth semiconductor regions, and separated from the second electrode. Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

In the drawings and the description recited below, the notations of $n^{++}$, $n^+$, n, $n^-$, $p^{++}$, $p^+$, and p indicate relative levels of the impurity concentrations. In other words, a notation marked with "+" indicates that the impurity concentration is relatively greater than that of a notation not marked with either "+" or "−", and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In the embodiments described below, each embodiment may be implemented by inverting the p-type and the n-type of each semiconductor region.

First Embodiment

Figure 2:
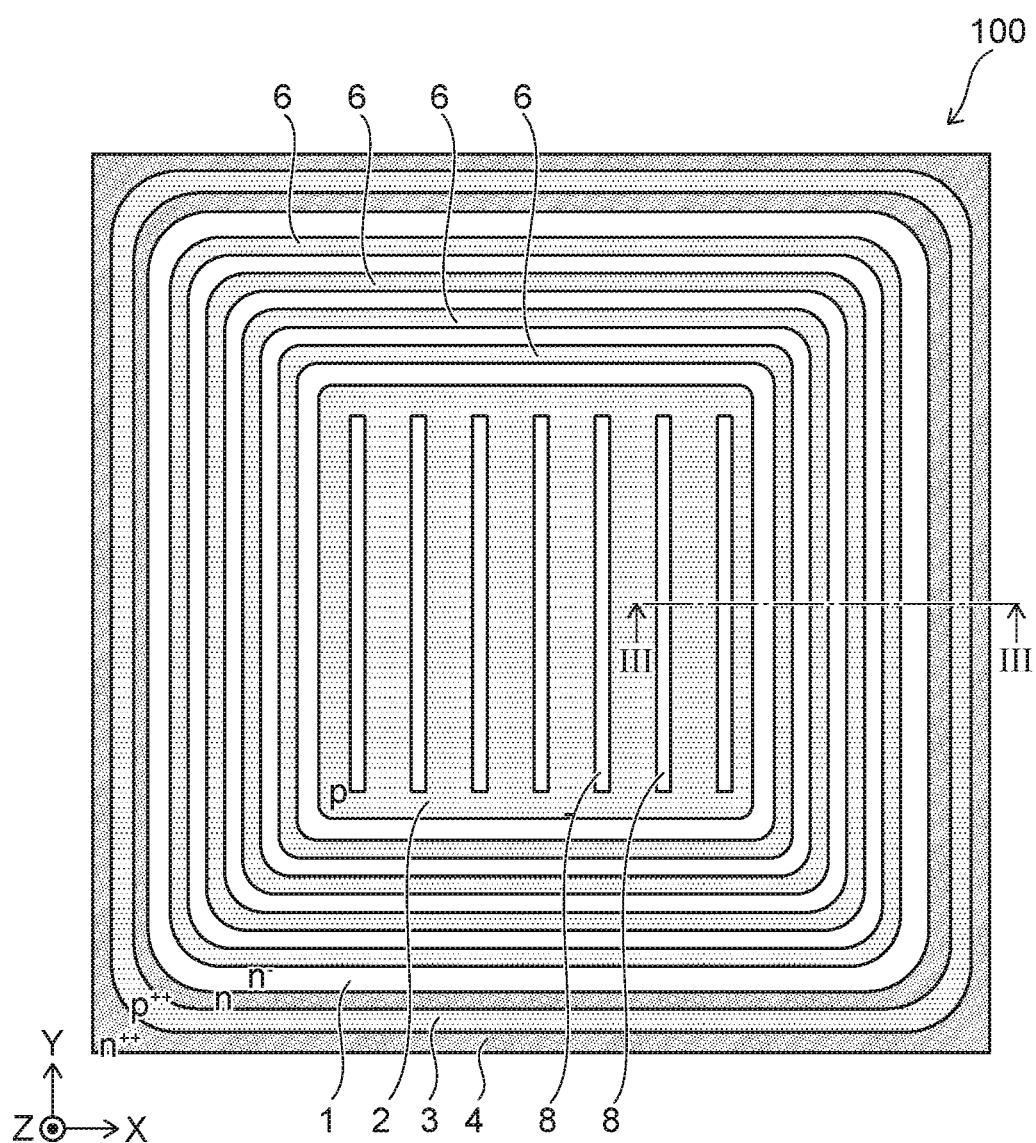
FIG. 2 is a plan view illustrating the semiconductor device according to the first embodiment.

FIGS. 1 and 2 are plan views illustrating a semiconductor device according to a first embodiment.

Figure 3:
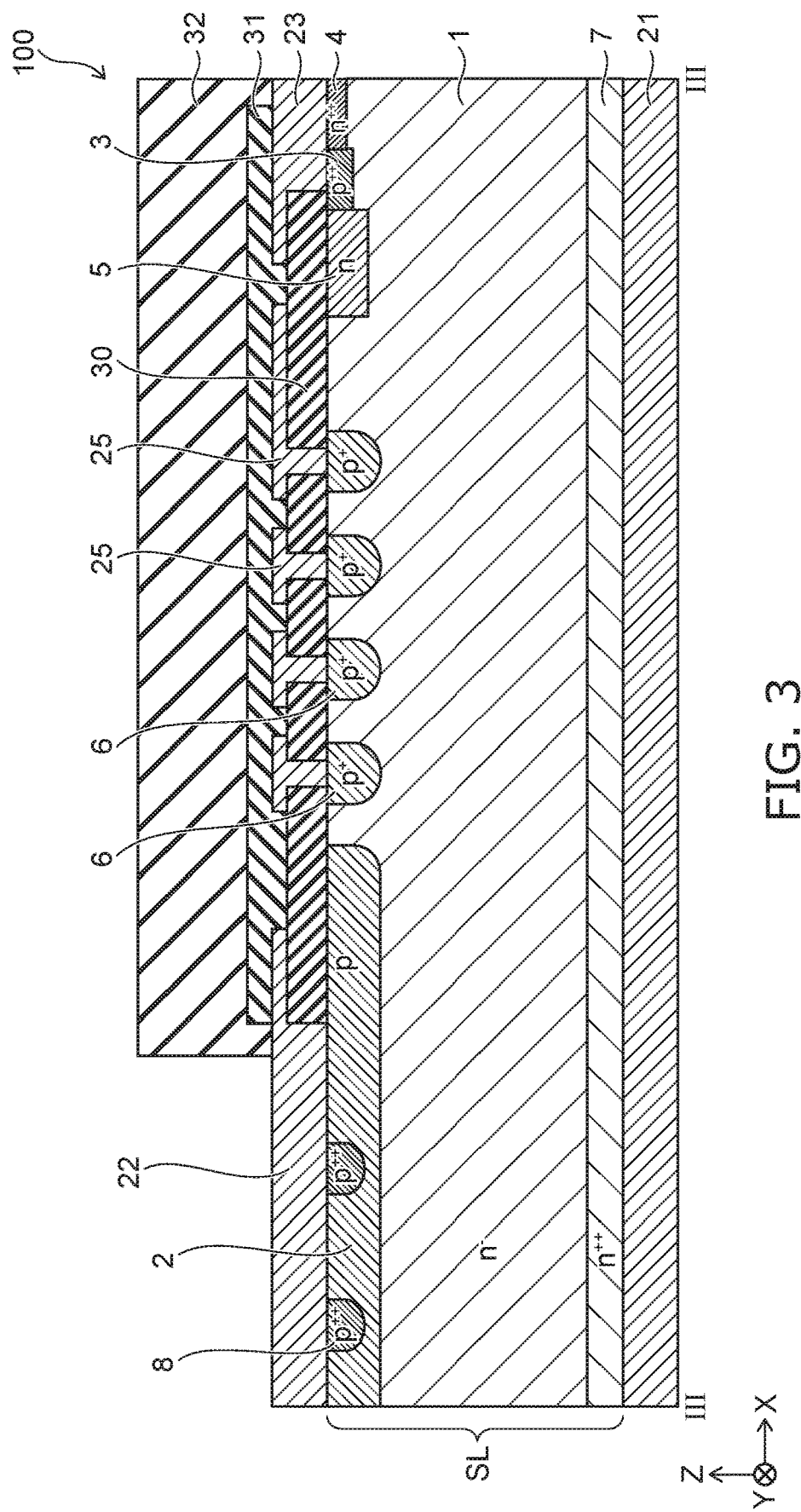
FIG. 3 is a III-III cross-sectional view of FIGS. 1 and 2.

FIG. 3 is a III-III cross-sectional view of FIGS. 1 and 2.

The semiconductor device 100 according to the first embodiment is a diode. As illustrated in FIGS. 1 to 3, the semiconductor device 100 includes a lower electrode 21 (a first electrode), an upper electrode 22 (a second electrode), an equivalent-potential ring (EQPR) electrode 23 (a third electrode), a conductive layer 25, an insulating layer 30, an insulating layer 31, and a sealing portion 32. The insulating layer 31 and the sealing portion 32 are not illustrated in FIG. 1. The upper electrode 22, the EQPR electrode 23, the conductive layer 25, the insulating layer 30, the insulating layer 31, and the sealing portion 32 are not illustrated in FIG. 2.

As illustrated in FIGS. 2 and 3, a semiconductor layer SL includes an $n^-$-type (first-conductivity-type) semiconductor region 1 (a first semiconductor region), a p-type (second-conductivity-type) semiconductor region 2 (a second semiconductor region), a $p^{++}$-type semiconductor region 3 (a third semiconductor region), an $n^{++}$-type EQPR region 4 (a fourth semiconductor region), an n-type stopper region 5 (a fifth semiconductor region), a $p^+$-type guard ring region 6 (a sixth semiconductor region), an $n^{++}$-type contact region 7, and a $p^{++}$-type contact region 8.

An XYZ orthogonal coordinate system is used in the description of the embodiments of the application. The direction from the lower electrode 21 toward the n⁻-type semiconductor region 1 is taken as a Z-direction (a first direction). Two mutually-orthogonal directions perpendicular to the Z-direction are taken as an X-direction (a second direction) and a Y-direction (a third direction). A direction from the center toward the outer perimeter of the semiconductor device 100 is taken as a diametrical direction. In the description, the direction from the lower electrode 21 toward the n⁻-type semiconductor region 1 is called "up", and the reverse direction is called "down". These directions are based on the relative positional relationship between the lower electrode 21 and the n⁻-type semiconductor region 1 and are independent of the direction of gravity.

As illustrated in FIG. 3, the lower electrode 21 is provided at the lower surface of the semiconductor device 100. The n⁺⁺-type contact region 7 is provided on the lower electrode 21 and is electrically connected to the lower electrode 21. The n⁻-type semiconductor region 1 is provided on the n⁺⁺-type contact region 7. The n⁻-type semiconductor region 1 is electrically connected to the lower electrode 21 via the n⁺⁺-type contact region 7.

The p-type semiconductor region 2, the p⁺⁺-type semiconductor region 3, the n⁺⁺-type EQPR region 4, the n-type stopper region 5, and the p⁺-type guard ring region 6 are provided on the n⁻-type semiconductor region 1. For example, as illustrated in FIG. 2, the p-type semiconductor region 2 is provided at the central portion of the semiconductor device 100 in the X-direction and the Y-direction.

The p⁺⁺-type semiconductor region 3 is provided around the p-type semiconductor region 2 along the X-Y plane (a first plane). The p⁺⁺-type semiconductor region 3 is separated from the p-type semiconductor region 2. The n⁺⁺-type EQPR region 4 is provided around the p⁺⁺-type semiconductor region 3 along the X-Y plane. The n⁺⁺-type EQPR region 4 may contact the p⁺⁺-type semiconductor region 3 or may be separated from the p⁺⁺-type semiconductor region 3. For example, the n⁺⁺-type EQPR region 4 is provided along the X-direction end portions and the Y-direction end portions of the semiconductor device 100. The n-type impurity concentration in the n⁺⁺-type EQPR region 4 is greater than the n-type impurity concentration in the n⁻-type semiconductor region 1.

The n-type stopper region 5 is provided between the p-type semiconductor region 2 and the p⁺⁺-type semiconductor region 3. The n-type stopper region 5 is provided around the p-type semiconductor region 2 along the X-Y plane and is surrounded with the p⁺⁺-type semiconductor region 3. The n-type stopper region 5 may contact the p⁺⁺-type semiconductor region 3 or may be separated from the p⁺⁺-type semiconductor region 3. The n-type impurity concentration in the n-type stopper region 5 is greater than the n-type impurity concentration in the n⁻-type semiconductor region 1 but less than the n-type impurity concentration of the EQPR. For example, the lower end of the n-type stopper region 5 is positioned lower than the lower end of the p⁺⁺-type semiconductor region 3.

The p⁺-type guard ring region 6 is provided between the p-type semiconductor region 2 and the n-type stopper region 5. The p⁺-type guard ring region 6 is separated from the p-type semiconductor region 2 and the n-type stopper region 5.

Multiple p⁺-type guard ring regions 6 are provided along the diametrical direction. The multiple p⁺-type guard ring regions 6 each are provided around the p-type semiconductor region 2 along the X-Y plane. The multiple p⁺-type guard ring regions 6 are separated from each other. The number of the p⁺-type guard ring regions 6 is designed appropriately according to the necessary breakdown voltage of the semiconductor device 100.

As illustrated in FIGS. 2 and 3, the p⁺⁺-type contact region 8 is provided selectively on the p-type semiconductor region 2. The configuration, the number, the position, etc., of the p⁺⁺-type contact region 8 are designed appropriately according to the necessary characteristics of the semiconductor device 100.

The upper electrode 22 is provided on the p-type semiconductor region 2 and the p⁺⁺-type contact region 8 and is electrically connected to the p-type semiconductor region 2 and the p⁺⁺-type contact region 8. The EQPR electrode 23 is provided on the p⁺⁺-type semiconductor region 3 and the n⁺⁺-type EQPR region 4 and is electrically connected to the p⁺⁺-type semiconductor region 3 and the n⁺⁺-type EQPR region 4. Multiple conductive layers 25 are provided along the diametrical direction. The multiple conductive layers 25 are provided respectively on the multiple p⁺-type guard ring regions 6 and are electrically connected respectively to the multiple p⁺-type guard ring regions 6.

For example, as illustrated in FIG. 1, the upper electrode 22 is provided at the central portion of the semiconductor device 100 in the X-direction and the Y-direction. The multiple conductive layers 25 each are provided around the upper electrode 22 along the X-Y plane. The EQPR electrode 23 is provided around the multiple conductive layers 25 along the X-Y plane. For example, the EQPR electrode 23 is provided along the X-direction end portions and the Y-direction end portions of the semiconductor device 100. The upper electrode 22, the EQPR electrode 23, and the multiple conductive layers 25 are separated from each other in the diametrical direction.

The upper surface of the n⁻-type semiconductor region 1 is covered with the multiple insulating layers 30 between the p-type semiconductor region 2 and the p⁺-type guard ring region 6, between the p⁺-type guard ring regions 6, and between the p⁺-type guard ring region 6 and the p⁺⁺-type semiconductor region 3. The outer perimeter portion of the upper electrode 22 and the inner perimeter portions of the multiple conductive layers 25 and the EQPR electrode 23 are covered with the insulating layer 31. The sealing portion 32 is provided on the insulating layer 31.

The insulating layer 31 may not be provided. Or, the insulating layer 31 may be semi-Insulative. In such a case, the electrical resistivity of the insulating layer 31 is less than the electrical resistivity of the insulating layer 30.

An operation of the semiconductor device 100 will now be described.

When a positive voltage with respect to the lower electrode 21 is applied to the upper electrode 22, a forward voltage is applied at the p-n junction surface between the n⁻-type semiconductor region 1 and the p-type semiconductor region 2. Thereby, the semiconductor device 100 is set to an on-state, and a current flows from the upper electrode 22 toward the lower electrode 21.

Subsequently, when a positive voltage with respect to the upper electrode 22 is applied to the lower electrode 21, the flow of the current stops, and the semiconductor device 100 is switched from the on-state to an off-state. A reverse voltage is applied at the p-n junction surface between the n⁻-type semiconductor region 1 and the p-type semiconductor region 2. A depletion layer spreads from the p-n junction surface between the n⁻-type semiconductor region 1 and the p-type semiconductor region 2 due to the application of the reverse voltage. The depletion layer spreads along the Z-direction in the element region in which the p-type semiconductor region 2 is provided. The depletion layer spreads in the diametrical direction toward the outer perimeter of the semiconductor device 100 in the terminal region around the element region.

When the depletion layer spreading from the p-type semiconductor region 2 reaches the p$^+$-type guard ring region 6, a reverse voltage is applied also between the n$^-$-type semiconductor region 1 and the p$^+$-type guard ring region 6. Thereby, the depletion layer is caused to spread also from the p-n junction surface between the n$^-$-type semiconductor region 1 and the p$^+$-type guard ring region 6. Due to the spreading of the depletion layer from each p$^+$-type guard ring region 6, the electric field concentration at the outer perimeter of the p-type semiconductor region 2 can be suppressed, and the breakdown voltage of the semiconductor device 100 can be increased.

When the semiconductor device 100 is in the off-state, the potential of the EQPR electrode 23 is substantially equal to the potential of the lower electrode 21. The p$^+$-type guard ring regions 6 between the upper electrode 22 and the EQPR electrode 23 are electrically connected to the conductive layers 25. The potentials of the p$^+$-type guard ring regions 6 are equal to the potentials of the conductive layers 25. The spacing of the multiple conductive layers 25 is designed to be as narrow as possible in a range in which electric field concentration does not occur. The conductive layers 25 relax the electric field at the p$^+$-type guard ring region 6 vicinities. Thereby, the fluctuation of the potentials of the p$^+$-type guard ring regions 6 is suppressed, and the spreading of the depletion layer toward the outer perimeter of the semiconductor device 100 is more stable.

Examples of the materials of the components of the semiconductor device 100 will now be described.

The n$^-$-type semiconductor region 1, the p-type semiconductor region 2, the p$^{++}$-type semiconductor region 3, the n$^{++}$-type EQPR region 4, the n-type stopper region 5, the p$^+$-type guard ring region 6, the n$^{++}$-type contact region 7, and the p$^{++}$-type contact region 8 include silicon, silicon carbide, gallium nitride, or gallium arsenide as semiconductor materials. Arsenic, phosphorus, or antimony can be used as an n-type impurity when silicon is used as the semiconductor material. Boron can be used as a p-type impurity.

The lower electrode 21, the upper electrode 22, the EQPR electrode 23, and the conductive layer 25 include metals such as aluminum, copper, etc. The lower electrode 21, the upper electrode 22, the EQPR electrode 23, and the conductive layer 25 may include polysilicon to which phosphorus, boron, or the like is added.

The insulating layers 30 and 31 include insulating materials such as silicon oxide, silicon nitride, etc. The sealing portion 32 includes an insulating resin material such as polyimide, etc.

When the insulating layer 31 includes silicon oxide or silicon nitride, a relatively high amount of silicon may be included in the insulating layer 31. Thereby, the insulating layer 31 is semi-insulative. Or, the insulating layer 31 may include an amorphous carbon structure substance including hydrocarbon and a carbon allotrope as a semi-insulating material. The electrical resistivity of the semi-insulative insulating layer 31 is, for example, not less than $1.0 \times 10^8$ ($\Omega \cdot cm$) but less than $1.0 \times 10^{13}$ ($\Omega \cdot cm$). The electrical resistivity of the insulating layer 30 is, for example, $1.0 \times 10^{13}$ ($\Omega \cdot cm$) or more.

Problems relating to the first embodiment and effects according to the first embodiment will now be described.

Figure 4:
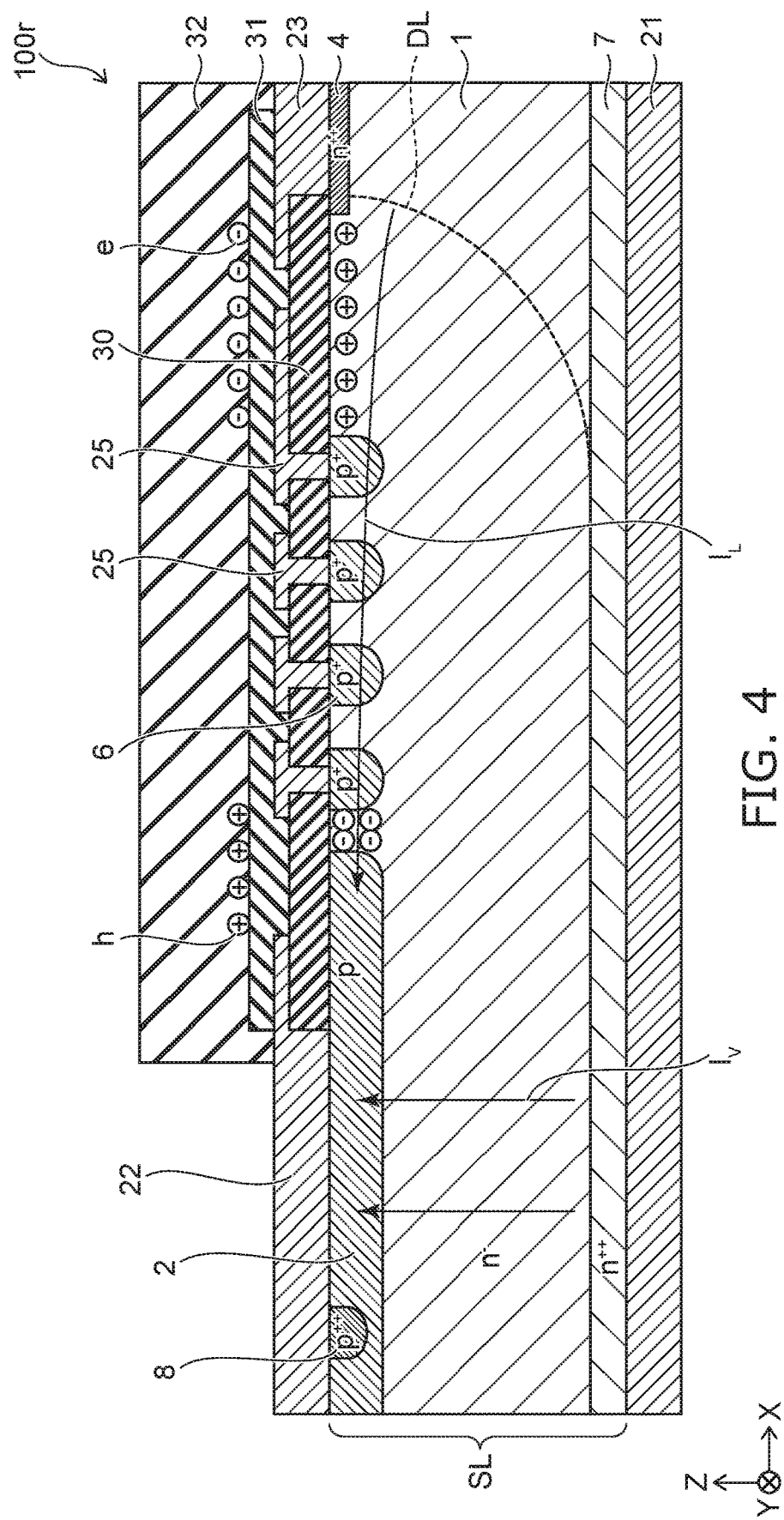
FIG. 4 is a cross-sectional view illustrating a portion of a semiconductor device according to a reference example.

FIG. 4 is a cross-sectional view illustrating a portion of a semiconductor device according to a reference example.

Figure 5A:
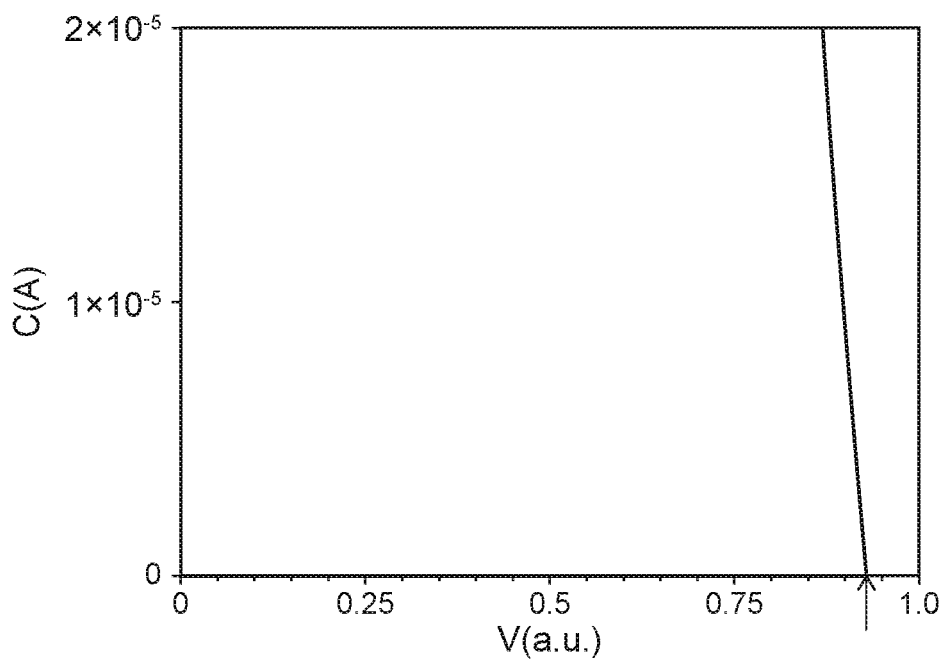
FIGS. 5A and 5B are graphs illustrating characteristics of the semiconductor device according to the reference example and the first embodiment.

FIG. 5A is a graph illustrating a characteristic of the semiconductor device according to the reference example.

Figure 5B:
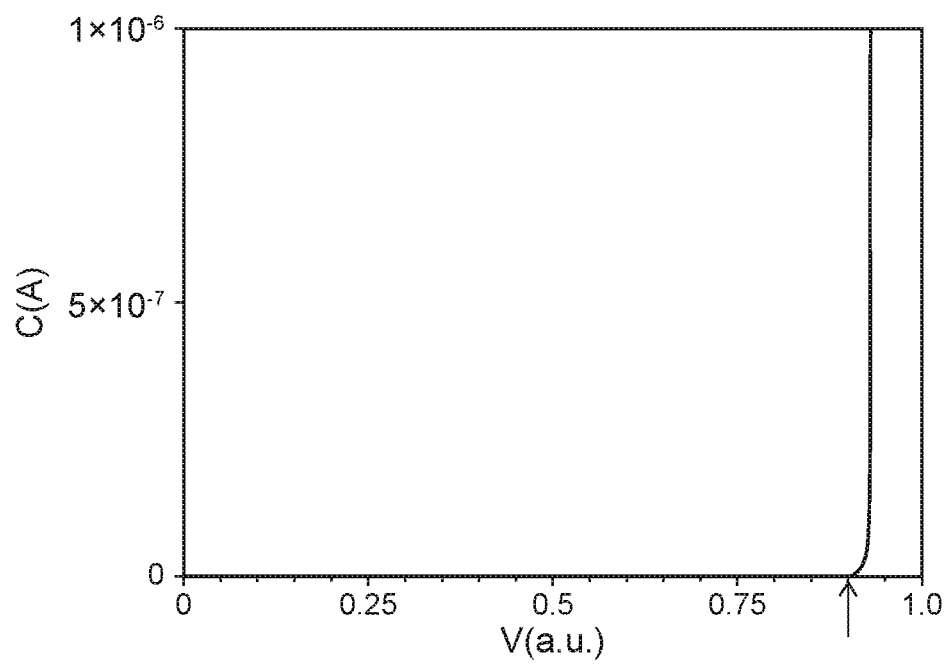

FIG. 5B is a graph illustrating a characteristic of the semiconductor device according to the first embodiment.

Figure 6:
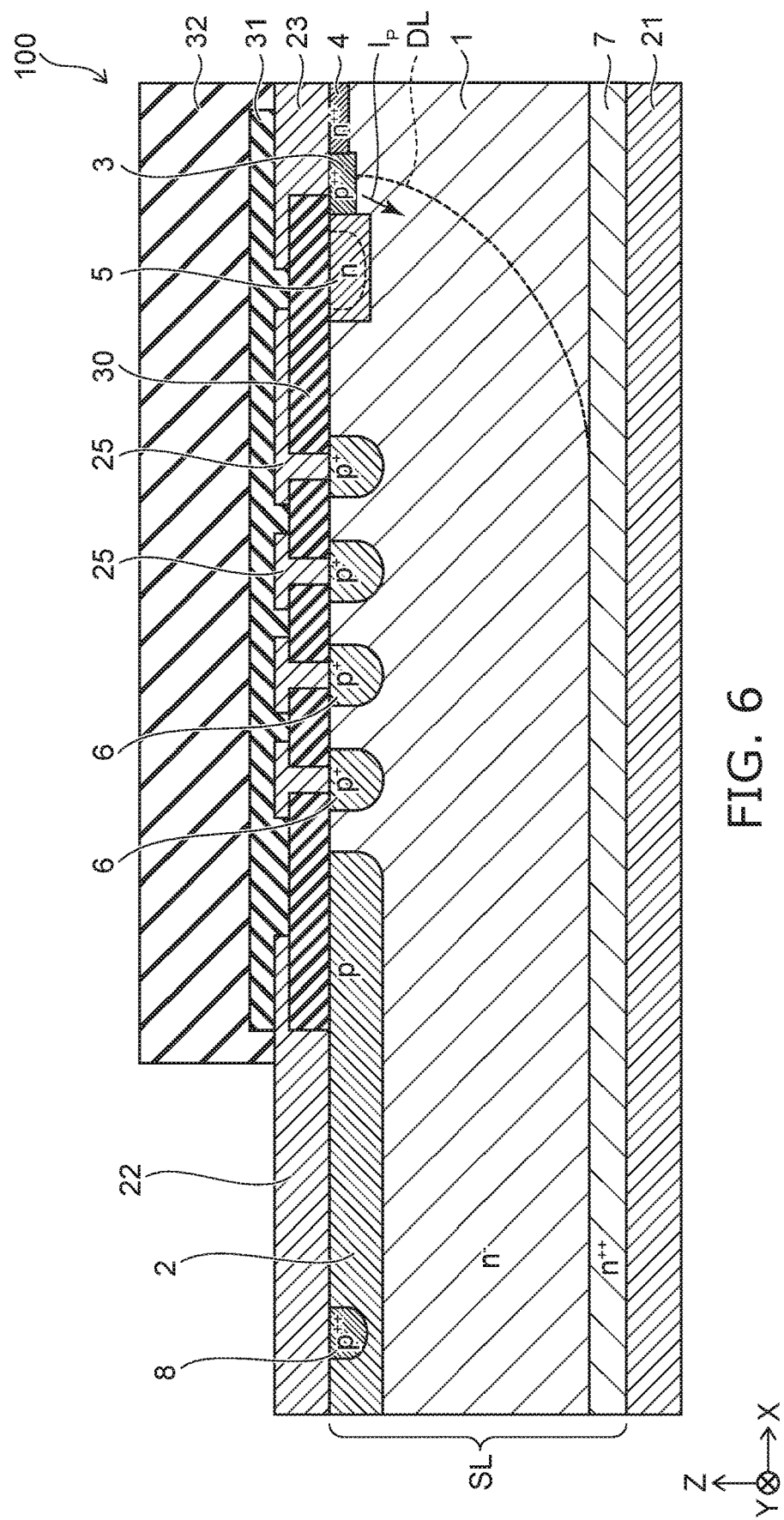
FIG. 6 is a cross-sectional view illustrating a portion of the semiconductor device according to the first embodiment.

FIG. 6 is a cross-sectional view illustrating a portion of the semiconductor device according to the first embodiment.

The semiconductor device 100r according to the reference example differs from the semiconductor device 100 according to the first embodiment in that the p$^{++}$-type semiconductor region 3 and the n-type stopper region 5 are not included.

A first problem relates to the breakdown of the semiconductor device. When the semiconductor device 100r is turned off, a depletion layer DL spreads from the p-n junction surface between the n$^-$-type semiconductor region 1 and the p-type semiconductor region 2. At this time, for some reason, when a voltage that is greater than the permissible voltage is applied to the semiconductor device 100r, the electric field intensity at the depleted n$^-$-type semiconductor region 1 increases, and avalanche breakdown may occur temporarily.

The avalanche breakdown occurs at multiple locations in the semiconductor device 100r. The semiconductor device 100r is damaged if the current that is generated at multiple locations concentrates and a large current locally flows. Therefore, it is desirable to suppress the generation of a local large current at breakdown.

When the voltage that is greater than the permissible voltage is applied to the semiconductor device 100r, avalanche breakdown occurs along the Z-direction in the semiconductor layer SL if the electric field intensity in the Z-direction is greater than the electric field intensity in the diametrical direction. Thereby, as illustrated in FIG. 4, a current $I_V$ flows along the Z-direction. On the other hand, avalanche breakdown occurs in the diametrical direction if the electric field intensity in the diametrical direction is greater than the electric field intensity in the Z-direction. In such a case, a current $I_L$ flows along the diametrical direction.

When the avalanche breakdown occurs in the diametrical direction, the distance from the starting point of the avalanche breakdown to the n$^-$-type semiconductor region 1 that is not depleted is short. Therefore, the current $I_L$ flows through the multiple p$^+$-type guard ring regions 6 from the undepleted region of the n$^-$-type semiconductor region 1. At this time, a hole current flows from the starting point of the avalanche breakdown toward the p-type semiconductor region 2 at the front surface portion of the terminal region including the multiple p$^+$-type guard ring regions 6. The holes relax the electric field. Therefore, the region in which the hole current flows functions as a ballast resistance. The increase of the current $I_L$ is suppressed thereby.

Conversely, when avalanche breakdown occurs in the Z-direction, the starting point of the avalanche breakdown is at the p-n junction surface between the n$^-$-type semiconductor region 1 and the p-type semiconductor region 2. An electron current flows in the n$^-$-type semiconductor region 1. The electrons strengthen the electric field. Therefore, there is a possibility that the current $I_V$ may continue to increase and the semiconductor device 100r may be damaged.

In FIGS. 5A and 5B, the horizontal axis is a voltage V with respect to the upper electrode 22 that is applied to the lower electrode 21. The vertical axis is a current C. FIGS. 5A and 5B illustrate the change of the current when the voltage applied to the lower electrode 21 is increased in the semiconductor devices 100 and 100r. FIG. 5A illustrates the characteristic when avalanche breakdown occurs along the Z-direction in the semiconductor device 100r according to the reference example. It can be seen that in the example illustrated in FIG. 5A, after breakdown occurs at the point shown by the arrow, the voltage decreases as the current increases, and a negative resistance occurs.

Therefore, to reduce the likelihood of the semiconductor device 100r being damaged at breakdown, it is desirable for the avalanche breakdown to occur in the diametrical direction in the semiconductor layer SL. By causing the avalanche breakdown to occur in the diametrical direction, the likelihood of the semiconductor device 100r being damaged at breakdown can be reduced. In other words, the ruggedness of the semiconductor device 100r at breakdown can be improved. In particular, by causing the avalanche breakdown to occur at the outer perimeter of the $p^+$-type guard ring regions 6, the function of the $p^+$-type guard ring regions 6 as a ballast resistance can be increased.

A second problem relates to fluctuation of the breakdown voltage due to an external charge. When a positive voltage with respect to the upper electrode 22 is applied to the lower electrode 21, the potential of the EQPR electrode 23 becomes substantially equal to the potential of the lower electrode 21. An electric field along the diametrical direction is generated between the upper electrode 22 and the EQPR electrode 23. External charge is attracted by the electric field. The external charge includes the charge and ions included in the sealing portion 32, charge outside the semiconductor device 100r, etc. As a result, as illustrated in FIG. 4, a negative charge e accumulates at the outer perimeter of the semiconductor device 100r above the semiconductor layer SL. A positive charge h accumulates at the center of the semiconductor device 100r.

The positive charge h accumulates at the outer perimeter of the semiconductor layer SL upper surface by the electric field formed by the accumulated external charge. The negative charge e accumulates at the center of the semiconductor layer SL upper surface. The spreading of the depletion layer DL is promoted by the charge accumulated in the semiconductor layer SL. Therefore, the depletion layer DL easily reaches the outer edge of the semiconductor device 100r and reduces the breakdown voltage of the semiconductor device 100r. To suppress the fluctuation of the breakdown voltage due to the external charge, it is desirable for the electric field intensity in the diametrical direction to be small.

For the first problem, to improve the ruggedness at breakdown, it is desirable for the electric field intensity in the diametrical direction to be high in the semiconductor device 100r. On the other hand, for the second problem, to suppress the fluctuation of the breakdown voltage due to the external charge, it is desirable for the electric field intensity in the diametrical direction to be low in the semiconductor device 100r. In other words, in the semiconductor device 100r according to the reference example, the improvement of the ruggedness at breakdown and the suppression of the fluctuation of the breakdown voltage have a trade-off relationship.

To improve the trade-off relationship, the semiconductor device 100 according to the first embodiment includes the $p^{++}$-type semiconductor region 3. The $p^{++}$-type semiconductor region 3 is provided at the outer perimeter vicinity of the semiconductor device 100 and is electrically connected to the EQPR electrode 23. As illustrated in FIG. 6, the $p^{++}$-type semiconductor region 3 is provided at a position reached by the depletion layer DL at turn-off of the semiconductor device 100. When the depletion layer DL reaches the $p^{++}$-type semiconductor region 3, a voltage is applied in the forward direction at the p-n junction surface between the $n^-$-type semiconductor region 1 and the $p^{++}$-type semiconductor region 3. At this time, electrons are supplied from the lower electrode 21 to the EQPR electrode 23 via the $n^{++}$-type contact region 7, the $n^-$-type semiconductor region 1, and the $n^{++}$-type EQPR region 4. The electrons are replaced with holes in the EQPR electrode 23, and the holes are supplied to the $p^{++}$-type semiconductor region 3. A current $I_P$ flows from the $p^{++}$-type semiconductor region 3 toward the $n^-$-type semiconductor region 1, and breakdown occurs in the semiconductor device 100.

The current $I_P$ flows due to the supply of the holes via the $p^{++}$-type semiconductor region 3. Therefore, when the current $I_P$ flows, the holes relax the electric field of the $n^-$-type semiconductor region 1. The region in which the hole current flows functions as a ballast resistance. The increase of the current $I_P$ at breakdown can be suppressed thereby. In the example illustrated in FIG. 5B, the current increases as the voltage increases after the breakdown occurs at the point shown by the arrow. Subsequently, the voltage is substantially constant, and only the current increases. In other words, compared to the semiconductor device 100r, the occurrence of the negative resistance in the semiconductor device 100 is suppressed.

The position of the $p^{++}$-type semiconductor region 3 is designed so that the depletion layer DL reaches the $p^{++}$-type semiconductor region 3 before the occurrence of the avalanche breakdown in the Z-direction or the diametrical direction. The occurrence of the avalanche breakdown can be suppressed by the breakdown occurring due to the current $I_P$. The likelihood of the semiconductor device being damaged due to avalanche breakdown can be reduced, and the ruggedness of the semiconductor device 100 at breakdown can be improved. Also, because the occurrence of the avalanche breakdown is suppressed, it is unnecessary to increase electric field intensity in the diametrical direction. The external charge that accumulates is suppressed by reducing the electric field intensity in the diametrical direction. As a result, the fluctuation of the breakdown voltage of the semiconductor device 100 due to the external charge can be suppressed.

As described above, according to the first embodiment, the ruggedness of the semiconductor device 100 at breakdown can be improved, and the fluctuation of the breakdown voltage of the semiconductor device 100 due to the external charge can be suppressed.

A voltage $V_P$ is less than a voltage $V_V$ and less than a voltage $V_L$, where $V_P$ is the voltage at which the depletion layer DL reaches the $p^{++}$-type semiconductor region 3, $V_V$ is the voltage at which avalanche breakdown occurs along the Z-direction in the semiconductor layer SL, and $V_L$ is the voltage at which avalanche breakdown occurs along the diametrical direction in the semiconductor layer SL. For example, as a result of reducing the electric field intensity in the diametrical direction of the semiconductor device 100, the voltage $V_L$ is greater than the voltage $V_V$.

A desirable configuration of the semiconductor device according to the first embodiment will now be described.

It is favorable for the semiconductor device 100 to include the multiple $p^+$-type guard ring regions 6. By providing the multiple $p^+$-type guard ring regions 6, the depletion layer DL is caused to spread easily toward the outer perimeter of the semiconductor device 100. Thereby, the electric field intensity at the outer perimeter of the p-type semiconductor region 2 is reduced, and the breakdown voltage of the semiconductor device 100 is increased. Also, the spreading of the depletion layer DL in the terminal region can be stabilized, and the fluctuation of the voltage $V_P$ can be suppressed.

It is favorable for the semiconductor device 100 to include the n-type stopper region 5. The n-type impurity concentration in the n-type stopper region 5 is designed so that the n-type stopper region 5 is not completely depleted when the depletion layer DL reaches the $p^{++}$-type semiconductor region 3. By providing the n-type stopper region 5, the spreading of the depletion layer DL is suppressed in the region in which the $p^{++}$-type semiconductor region 3 is provided. For example, by adjusting the position and the size of the n-type stopper region 5, the voltage $V_P$ at which the depletion layer DL reaches the $p^{++}$-type semiconductor region 3 can be controlled. By providing the n-type stopper region 5, the path of the current $I_P$ flowing from the $p^{++}$-type semiconductor region 3 toward the $n^-$-type semiconductor region 1 is confined. By adjusting the position and the size of the n-type stopper region 5, the magnitude of the current $I_P$ can be controlled.

Favorably, a portion of the EQPR electrode 23 and a portion of the conductive layer 25 next to the EQPR electrode 23 in the diametrical direction are positioned on the n-type stopper region 5. In other words, the gap between the EQPR electrode 23 and the conductive layer 25 next to each other in the diametrical direction is positioned on the n-type stopper region 5. In such a case, a portion of the electric field generated by the external charge is shielded by the EQPR electrode 23 and the conductive layer 25 at the outer perimeter of the semiconductor device 100. Holes accumulate in the n-type stopper region 5 by the electric field reaching the semiconductor layer SL via the gap between the EQPR electrode 23 and the conductive layer 25. The n-type impurity concentration in the n-type stopper region 5 is greater than the n-type impurity concentration in the $n^-$-type semiconductor region 1. Also, the n-type stopper region 5 is not completely depleted. The effects on the breakdown voltage when holes accumulate at the n-type stopper region 5 upper surface are less than the effects on the breakdown voltage when holes accumulate at the depleted $n^-$-type semiconductor region 1 upper surface. Therefore, the fluctuation of the breakdown voltage of the semiconductor device 100 due to the external charge can be suppressed further.

First Modification

Figure 7:
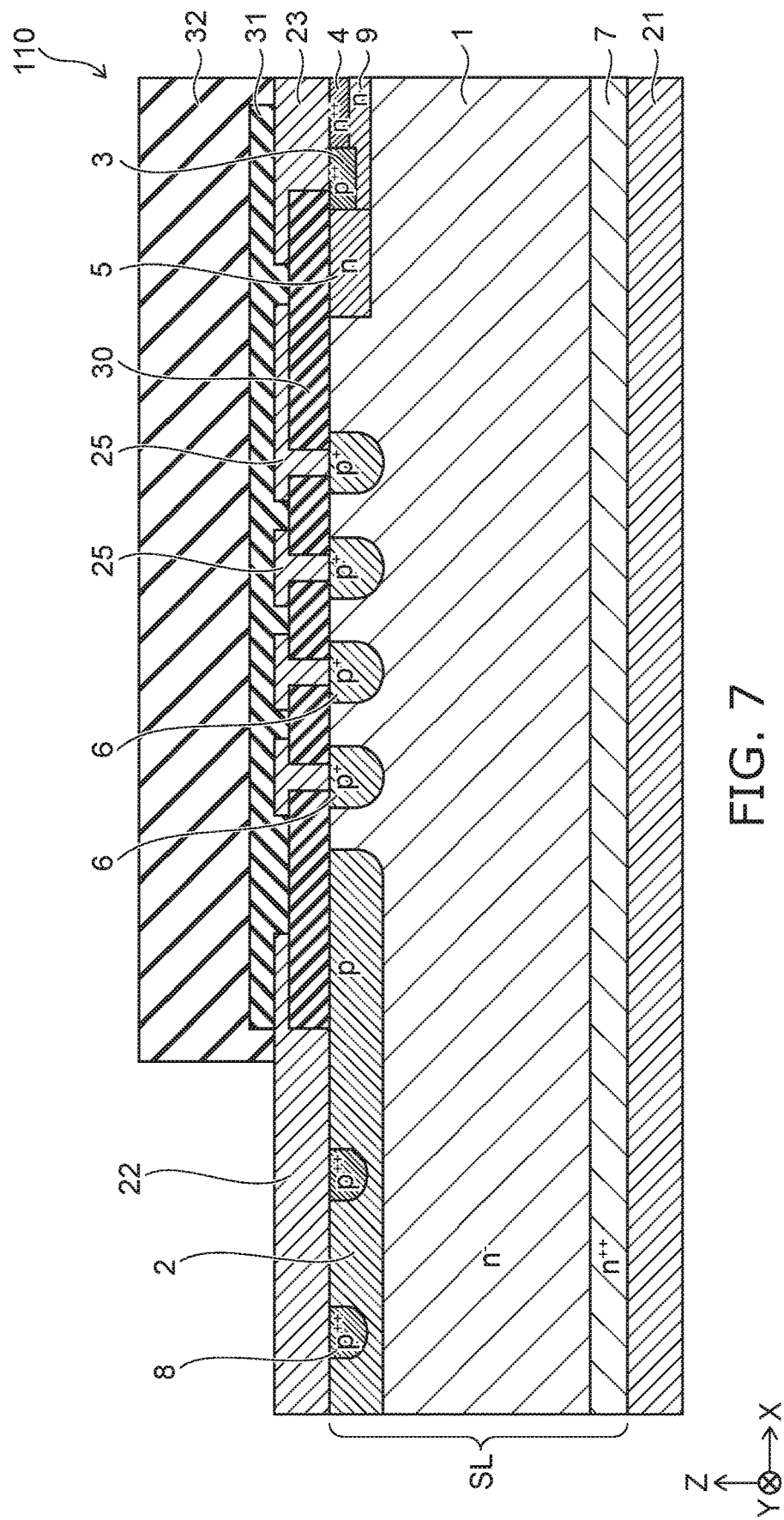
FIG. 7 is a cross-sectional view illustrating a portion of a semiconductor device according to a modification of the first embodiment.

FIG. 7 is a cross-sectional view illustrating a portion of a semiconductor device according to a modification of the first embodiment.

The semiconductor device 110 according to the modification illustrated in FIG. 7 differs from the semiconductor device 100 in that an n-type stopper region 9 (a seventh semiconductor region) is included.

The n-type stopper region 9 is provided under the $p^{++}$-type semiconductor region 3 and the $n^{++}$-type EQPR region 4. The n-type impurity concentration in the n-type stopper region 9 is greater than the n-type impurity concentration in the $n^-$-type semiconductor region 1 but less than the n-type impurity concentration in the $n^{++}$-type EQPR region 4. The n-type impurity concentration in the n-type stopper region 9 may be the same as or different from the n-type impurity concentration in the n-type stopper region 5. For example, the position in the Z-direction of the lower end of the n-type stopper region 5 is the same as the position in the Z-direction of the lower end of the n-type stopper region 9.

The n-type stopper region 9 may be linked to the n-type stopper region 5 or may be separated from the n-type stopper region 5. When the n-type stopper region 5 and the n-type stopper region 9 are linked, the n-type stopper region 9 is provided so that the n-type stopper region 9 is depleted below the $p^{++}$-type semiconductor region 3 when the semiconductor device 110 is in the off-state.

By providing the n-type stopper region 9, compared to the semiconductor device 100, the depletion layer can be more reliably prevented from reaching the outer edge of the semiconductor device 110. Also, by providing the n-type stopper region 9, similarly to the n-type stopper region 5, the path of the current $I_P$ flowing from the $p^{++}$-type semiconductor region 3 toward the $n^-$-type semiconductor region 1 is confined. The magnitude of the current $I_P$ can be controlled by adjusting the position and the size of the n-type stopper region 9.

Figure 8:
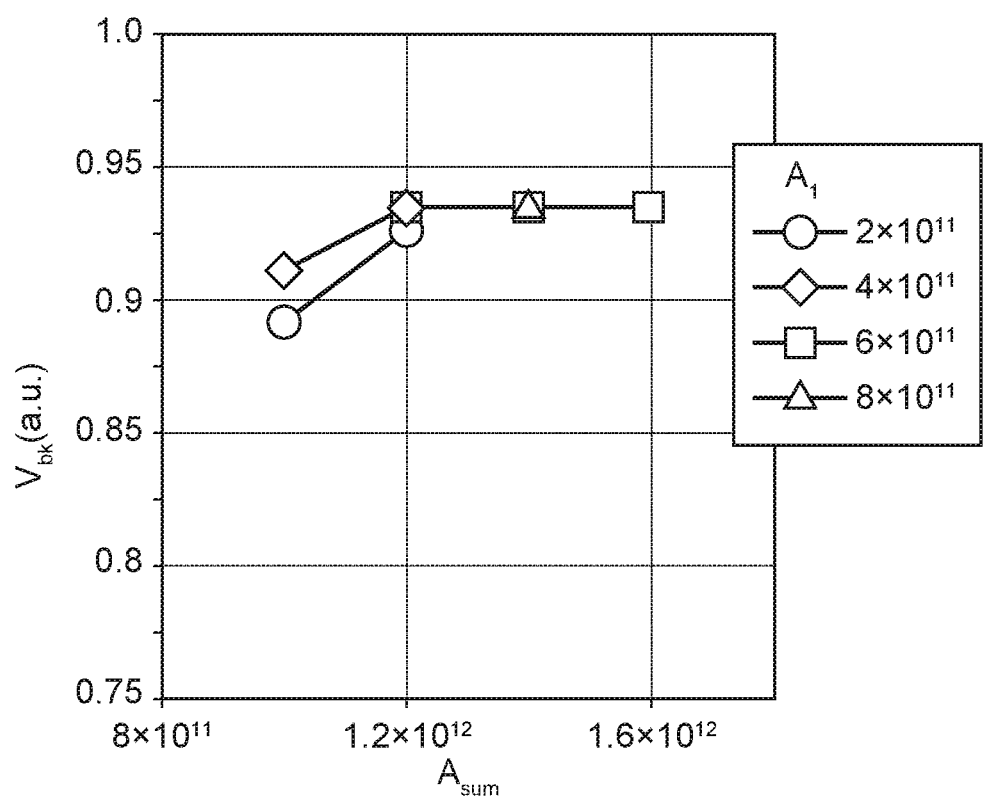
FIG. 8 is a graph illustrating characteristics of the semiconductor device according to the modification of the first embodiment.
Figure 9:
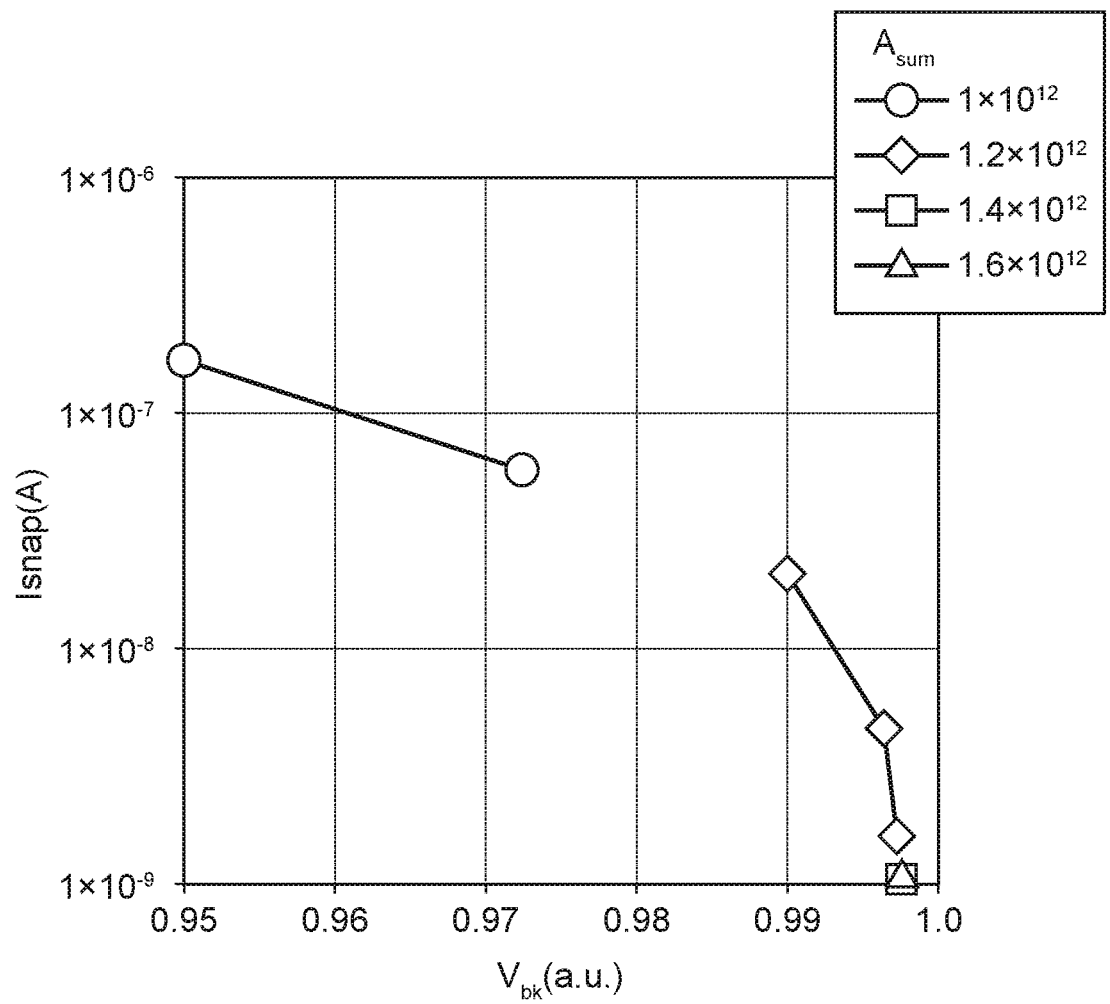
FIG. 9 is a graph illustrating characteristics of the semiconductor device according to the modification of the first embodiment.

FIGS. 8 and 9 are graphs illustrating characteristics of the semiconductor device according to the modification of the first embodiment.

In FIG. 8, the vertical axis is a voltage $V_{bk}$ at which breakdown occurs. The horizontal axis is a sum $A_{sum}$ of a total impurity amount $A_1$ of the n-type stopper region 5 and the total impurity amount of the n-type stopper region 9. The vertical axis has arbitrary units. FIG. 8 illustrates the change of the voltage $V_{bk}$ when the total impurity amount $A_1$ of the n-type stopper region 5 and the sum $A_{sum}$ are changed. The total impurity amount is the integral of the impurity concentration in the Z-direction per unit area in the X-Y plane.

It can be seen from FIG. 8 that compared to when the total impurity amount $A_1$ of the n-type stopper region 5 is $4.0 \times 10^{11}$ atoms/cm$^2$ or less, the voltage $V_{bk}$ is improved when the total impurity amount $A_1$ of the n-type stopper region 5 is $6.0 \times 10^{11}$ atoms/cm$^2$ or more. Accordingly, it is favorable for the total impurity amount $A_1$ of the n-type stopper region 5 to be $6.0 \times 10^{11}$ atoms/cm$^2$ or more. On the other hand, avalanche breakdown occurs when the total impurity amount $A_1$ is too large. Therefore, it is favorable for the total impurity amount $A_1$ of the n-type stopper region 5 to be $2.0 \times 10^{12}$ atoms/cm$^2$ or less.

In FIG. 9, the vertical axis is a snapback current $I_{snap}$. The horizontal axis is the voltage $V_{bk}$ at breakdown. The horizontal axis has arbitrary units. FIG. 9 illustrates the change of the snapback current $I_{snap}$ when the voltage $V_{bk}$ and the sum $A_{sum}$ are changed.

From FIG. 9, compared to when the sum $A_{sum}$ is $1.2 \times 10^{12}$ atoms/cm$^2$ or more, the snapback current $I_{snap}$ is extremely small when the sum $A_{sum}$ is $1.4 \times 10^{12}$ atoms/cm$^2$ or more. Accordingly, it is favorable for the sum $A_{sum}$ of the total impurity amount $A_1$ of the n-type stopper region 5 and the total impurity amount of the n-type stopper region 9 to be $1.4 \times 10^{12}$ atoms/cm$^2$ or less. On the other hand, punch-through occurs if the sum $A_{sum}$ is too small. Therefore, it is favorable for the sum $A_{sum}$ of the total impurity amount $A_1$ of the n-type stopper region 5 and the total impurity amount of the n-type stopper region 9 to be $1.0 \times 10^{12}$ atoms/cm$^2$ or more.

Second Embodiment

Figure 10:
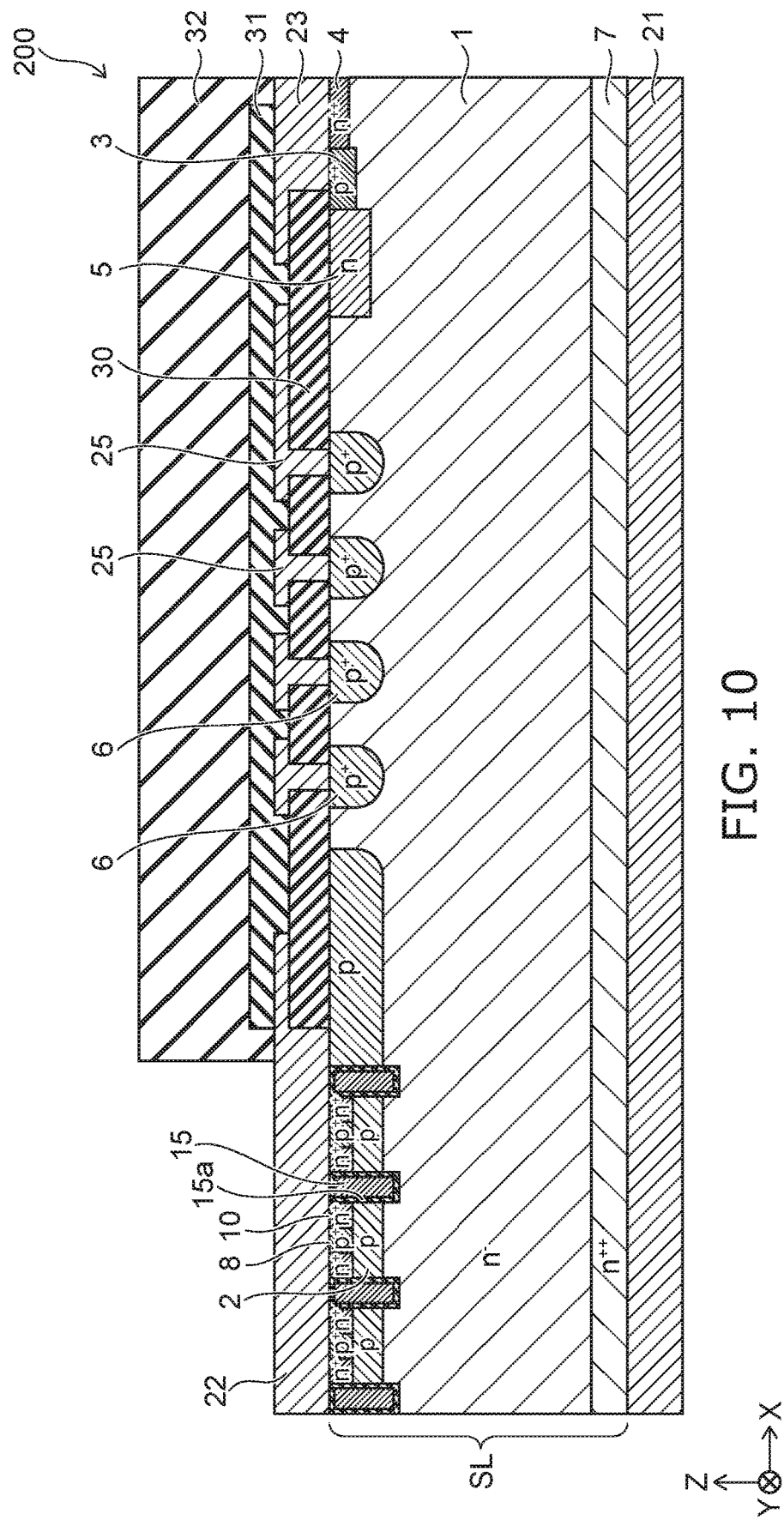
FIG. 10 is a cross-sectional view illustrating a portion of a semiconductor device according to a second embodiment.

FIG. 10 is a cross-sectional view illustrating a portion of a semiconductor device according to a second embodiment.

The semiconductor device 200 according to the second embodiment is a MOSFET. As illustrated in FIG. 10, compared to the semiconductor device 100, the semiconductor device 200 further includes an $n^{++}$-type source region 10 (an eighth semiconductor region) and a gate electrode 15.

The $p^{++}$-type contact region 8 and the $n^{++}$-type source region 10 are provided selectively on the p-type semiconductor region 2. The gate electrode 15 faces the p-type semiconductor region 2 via a gate insulating layer 15a. In the example illustrated in FIG. 10, the gate electrode 15 also faces the $n^{++}$-type source region 10 and a portion of the $n^-$-type semiconductor region 1. For example, pluralities of the p-type semiconductor region 2, the $p^{++}$-type contact region 8, the $n^{++}$-type source region 10, and the gate electrode 15 are provided in the X-direction, and each extend in the Y-direction.

An operation of the semiconductor device 200 will now be described.

A voltage that is not less than a threshold is applied to the gate electrode 15 in a state in which a positive voltage with respect to the upper electrode 22 is applied to the lower electrode 21. Thereby, a channel (an inversion layer) is formed in the p-type semiconductor region 2, and the semiconductor device 200 is set to the on-state. Electrons flow from the upper electrode 22 toward the lower electrode 21 via the channel. Subsequently, when the voltage applied to the gate electrode 15 becomes less than the threshold, the channel in the p-type semiconductor region 2 disappears, and the semiconductor device 200 is set to the off-state.

The structures of the $p^{++}$-type semiconductor region 3, the $n^{++}$-type EQPR region 4, and the EQPR electrode 23 of the semiconductor device 200 are similar to those of the semiconductor device 100. According to the second embodiment, similarly to the first embodiment, the ruggedness of the semiconductor device 200 at breakdown can be improved, and the fluctuation of the breakdown voltage of the semiconductor device 200 due to the external charge can be suppressed.

Third Embodiment

Figure 11:
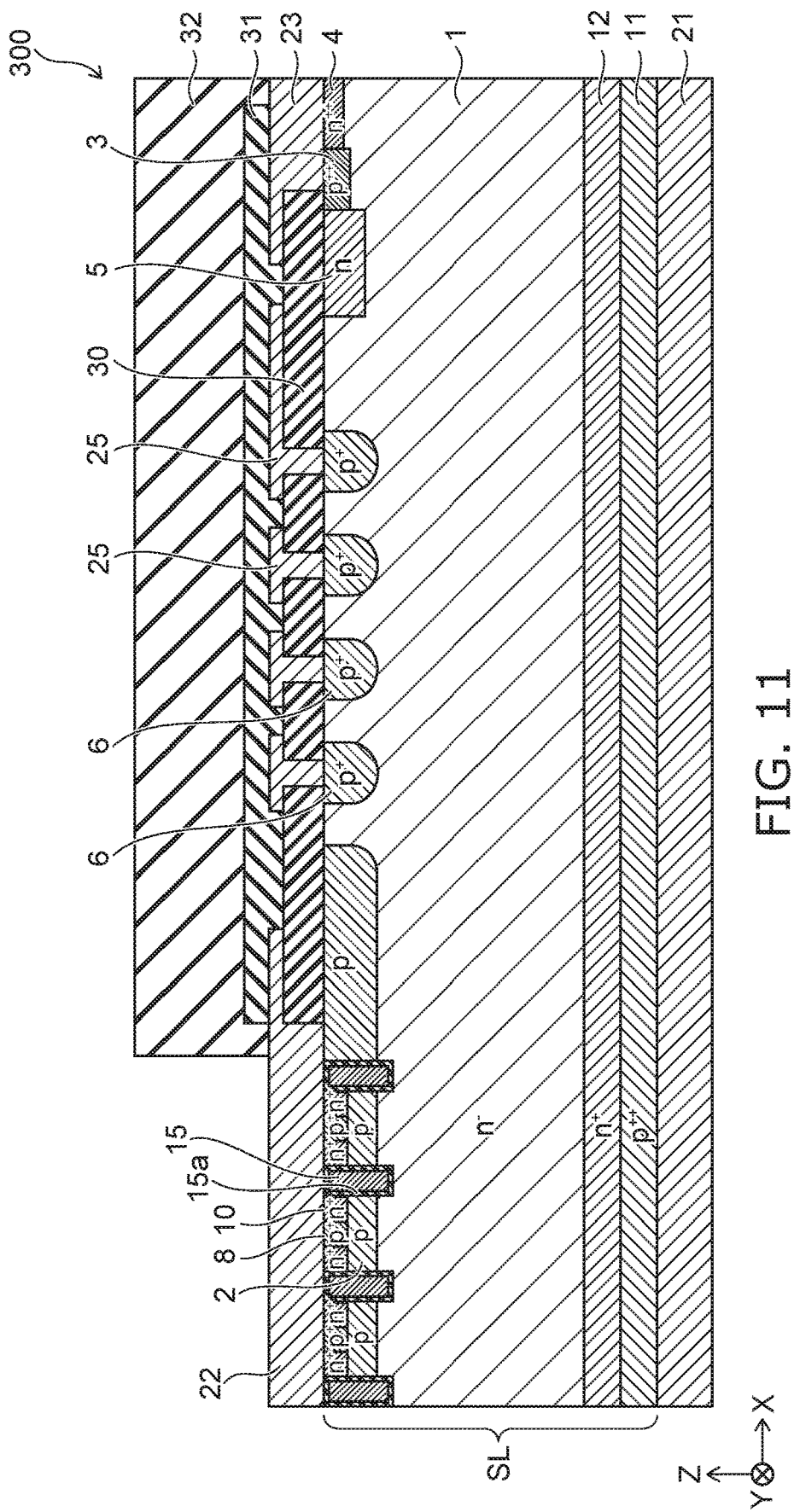
FIG. 11 is a cross-sectional view illustrating a portion of a semiconductor device according to a third embodiment.

FIG. 11 is a cross-sectional view illustrating a portion of a semiconductor device according to a third embodiment.

The semiconductor device 300 according to the third embodiment is an IGBT. As illustrated in FIG. 11, compared to the semiconductor device 100, the semiconductor device 300 further includes the $n^{++}$-type source region 10, a $p^{++}$-type collector region 11 (a ninth semiconductor region), an $n^+$-type buffer region 12, and the gate electrode 15.

The semiconductor device 300 is an IGBT. The semiconductor device 300 differs from the semiconductor device 200 in that the $p^{++}$-type collector region 11 and the $n^+$-type buffer region 12 are included instead of the $n^{++}$-type contact region 7. The $p^{++}$-type collector region 11 is provided between the lower electrode 21 and the $n^-$-type semiconductor region 1. The $n^+$-type buffer region 12 is provided between the $p^{++}$-type collector region 11 and the $n^-$-type semiconductor region 1. The $n^-$-type semiconductor region 1 is electrically connected to the lower electrode 21 via the $p^{++}$-type collector region 11 and the $n^+$-type buffer region 12. The n-type impurity concentration in the $n^+$-type buffer region 12 is greater than the n-type impurity concentration in the $n^-$-type semiconductor region 1 but less than the n-type impurity concentration in the $n^{++}$-type source region 10.

An operation of the semiconductor device 300 will now be described.

A voltage that is not less than a threshold is applied to the gate electrode 15 in a state in which a positive voltage with respect to the upper electrode 22 is applied to the lower electrode 21. Thereby, a channel (an inversion layer) is formed in the p-type semiconductor region 2, and the semiconductor device 300 is set to the on-state. When electrons flow from the upper electrode 22 toward the $n^-$-type semiconductor region 1 via the channel, holes are injected from the $p^{++}$-type collector region 11 into the $n^-$-type semiconductor region 1. Because conductivity modulation occurs in the $n^-$-type semiconductor region 1, the electrical resistance of the semiconductor device 300 is greatly decreased. Subsequently, when the voltage that is applied to the gate electrode 15 becomes less than the threshold, the channel in the p-type semiconductor region 2 disappears, and the semiconductor device 300 is set to the off-state.

After turn-off of the semiconductor device 300, when the depletion layer reaches the $p^{++}$-type semiconductor region 3, holes are supplied from the $p^{++}$-type collector region 11 to the $p^{++}$-type semiconductor region 3 via the $n^-$-type semiconductor region 1 in the undepleted region. Thereby, a current flows from the $p^{++}$-type semiconductor region 3 toward the $n^-$-type semiconductor region 1.

The structures of the $p^{++}$-type semiconductor region 3, the $n^{++}$-type EQPR region 4, and the EQPR electrode 23 of the semiconductor device 300 are similar to those of the semiconductor device 100. According to the third embodiment, similarly to the first embodiment, the decrease of the breakdown voltage of the semiconductor device 300 due to the external charge, the decrease of the breakdown voltage of the semiconductor device 300 at turn-off, and the improvement of the avalanche resistance of the semiconductor device 200 are possible, and the reliability of the semiconductor device 300 can be increased.

The semiconductor devices illustrated in FIGS. 10 and 11 have trench-gate structures in which the gate electrode 15 is provided inside the semiconductor layer SL. The semiconductor devices according to the second and third embodiments may have planar-gate structures in which the gate electrode 15 is provided on the semiconductor layer SL. As long as the semiconductor devices according to the second and third embodiments can operate respectively as a MOSFET and an IGBT, the specific structures of the p-type semiconductor region 2, the $p^{++}$-type contact region 8, the $n^{++}$-type source region 10, and the gate electrode 15 are modifiable as appropriate. Also, similarly to the semiconductor device according to the modification of the first embodiment, the semiconductor devices according to the second or third embodiment may include the n-type stopper region 9.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. It is also possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
a first electrode;
a first semiconductor region provided on the first electrode, the first semiconductor region being of a first conductivity type and being electrically connected to the first electrode;
a second semiconductor region provided on the first semiconductor region, the second semiconductor region being of a second conductivity type;
a third semiconductor region provided around the second semiconductor region along a first plane crossing a first direction, the third semiconductor region being of the second conductivity type and being separated from the second semiconductor region, the first direction being from the first electrode toward the first semiconductor region;
a fourth semiconductor region provided around the third semiconductor region along the first plane, the fourth semiconductor region being of the first conductivity type, an impurity concentration of the first conductivity type in the fourth semiconductor region being greater than an impurity concentration of the first conductivity type in the first semiconductor region;
a second electrode provided on the second semiconductor region and electrically connected to the second semiconductor region; and
a third electrode provided on the third and fourth semiconductor regions, electrically connected to the third and fourth semiconductor regions, and separated from the second electrode.

2. The device according to claim 1, further comprising:
a fifth semiconductor region provided between the second semiconductor region and the third semiconductor region, the fifth semiconductor region being of the first conductivity type,
an impurity concentration of the first conductivity type in the fifth semiconductor region being greater than the impurity concentration of the first conductivity type in the first semiconductor region but less than the impurity concentration of the first conductivity type in the fourth semiconductor region.

3. The device according to claim 2, further comprising:
a plurality of sixth semiconductor regions provided between the second semiconductor region and the fifth semiconductor region, the plurality of sixth semiconductor regions being of the second conductivity type,
the plurality of sixth semiconductor regions each being provided around the second semiconductor region along the first plane,
the plurality of sixth semiconductor regions being separated from the second and fifth semiconductor regions.

4. The device according to claim 3, further comprising:
a plurality of conductive layers provided respectively on the plurality of sixth semiconductor regions,
the plurality of conductive layers being electrically connected respectively to the plurality of sixth semiconductor regions,
the plurality of conductive layers each being provided around the second electrode along the first plane.

5. The device according to claim 4, wherein
one of the plurality of conductive layers is next to the third electrode in a direction from the second electrode toward the third electrode, and
a portion of the one of the plurality of conductive layers and a portion of the third electrode are positioned on the fifth semiconductor region.

6. The device according to claim 2, wherein
a total impurity amount of the first conductivity type in the fifth semiconductor region is not less than $6.0\times10^{11}$ atoms/cm$^2$ and not more than $2.0\times10^{12}$ atoms/cm$^2$.

7. The device according to claim 1, further comprising:
a seventh semiconductor region provided under the third and fourth semiconductor regions, the seventh semiconductor region being of the first conductivity type,
an impurity concentration of the first conductivity type in the seventh semiconductor region being greater than the impurity concentration of the first conductivity type in the first semiconductor region but less than the impurity concentration of the first conductivity type in the fourth semiconductor region.

8. The device according to claim 1, further comprising:
an eighth semiconductor region provided on the second semiconductor region, the eighth semiconductor region being of the first conductivity type,
a gate electrode facing the second semiconductor region via a gate insulating layer.

9. The device according to claim 8, further comprising:
a ninth semiconductor region provided between the first electrode and the first semiconductor region, the ninth semiconductor region being of the second conductivity type.

* * * * *